United States Patent

Kulik et al.

Patent Number: 5,562,841
Date of Patent: Oct. 8, 1996

[54] METHODS AND APPARATUS FOR TREATING A WORK SURFACE

[75] Inventors: Pavel Kulik; Vladimir Ivanov, both of Moscow, Russian Federation

[73] Assignee: Overseas Publishers Association (Amsterdam) BV, Amsterdam, Netherlands

[21] Appl. No.: 232,063

[22] PCT Filed: Oct. 30, 1992

[86] PCT No.: PCT/EP92/02549

§ 371 Date: Apr. 28, 1994

§ 102(e) Date: Apr. 28, 1994

[87] PCT Pub. No.: WO93/09261

PCT Pub. Date: May 13, 1993

[30] Foreign Application Priority Data

Nov. 1, 1991 [RU] Russian Federation ............ 5006147
Nov. 1, 1991 [RU] Russian Federation ............ 5006148
Nov. 1, 1991 [RU] Russian Federation ............ 5006149

[51] Int. Cl.$^6$ .................................................. B23K 10/00
[52] U.S. Cl. ...................... 219/121.59; 219/121.51; 219/121.47; 219/121.48; 219/76.16; 427/446

[58] Field of Search .................... 219/121.59, 121.47, 219/76.15, 76.16, 121.51, 121.56, 74, 75, 121.48; 427/446, 535

[56] References Cited

U.S. PATENT DOCUMENTS

| | | | |
|---|---|---|---|
| 2,918,563 | 12/1959 | Ternisien et al. | 219/74 |
| 3,317,704 | 5/1967 | Browning | 219/121.51 |
| 3,470,347 | 9/1969 | Jackson . | |
| 4,599,505 | 7/1986 | Lukens et al. | 219/74 |
| 4,743,734 | 5/1988 | Garlanov et al. | 219/121.51 |
| 5,393,948 | 2/1995 | Bjorkman, Jr. | 219/74 |

FOREIGN PATENT DOCUMENTS

| | | |
|---|---|---|
| 0234848 | 9/1987 | European Pat. Off. . |
| 2205830 | 5/1974 | France . |
| 1158182 | 11/1963 | Germany . |

*Primary Examiner*—Mark H. Paschall
*Attorney, Agent, or Firm*—Lowe, Price, LeBlanc & Becker

[57] ABSTRACT

A work surface, e.g. an integrated circuit, is treated with a plasma jet. The work surface is shielded from an ambient medium by a shielding gas jet directed to create a shielded zone around the work surface, or which is blown over the work surface so it intersects the plasma jet on the work surface.

22 Claims, 3 Drawing Sheets

METHODS AND APPARATUS FOR TREATING A WORK SURFACE

FIELD OF INVENTION

This invention relates to methods and apparatus for treating a work surface.

BACKGROUND

The invention has particular application in the machining of work surfaces by means of a gas plasma, in the protection of very clean surfaces and in applying a layer or coating to a surface. Such applications occur in many branches of the electrical, electronic and mechanical industries as well as in medical treatment, for example in a bacterial chamber.

Plasma machining methods and plants are known using controllable gaseous media in a special sealed chamber. The chamber is first pumped out completely and then filled with either a pure gas or a required mixture of gases. The plasma is activated by a high frequency, or ultra high frequency, glow or arc discharge which, depending on the composition of the gas mixture or the materials of the cathode or the anode, form the required composition of a plasma for cleaning, pickling or deposition of a film, (see for example V. I. Orlov and V. M. Garan, "Plasma Arc Spray Deposition of Coatings, Technology and Equipment", in the "Reviews of Electronic Equipment" series, "Technology, Production Management and Equipment", 1981 issue 18 (833), p. 46–47).

The chamber in such plants functions under low pressure. A higher vacuum tends towards a reduction of the unwanted impurities in the plasma. However, a higher vacuum also leads to a lower density of active particles and to a lower density of their flow towards the work surface which increases the duration of a treatment such as machining of the surface. This constitutes one of the reasons for a comparatively low output of such a plant. Furthermore, the low output is also a function of the need for a certain vacuum level to be continuously maintained, requiring the chamber to be pumped out. It is particularly important during the replacement of the plasma-generating gas that the chamber should be completely emptied of any particles in order to get rid of unwanted impurities that might cause problems during future machining of a work surface. This requirement entails prolonged preparation of the plant for operation. Furthermore, the use of gases containing aggressive active components, such as fluorine or chlorine, may induce reactions on the chamber walls, thus speeding up their wear. When such plants are used for a continuous machining processes, special sluice chambers have to be installed in order to enable there to be communication with the atmosphere. However, this requirement is liable to bring about contamination of a substrate which, for example in the field of electronics, is absolutely inadmissible.

A previously proposed method and apparatus for machining a solid body without a vacuum chamber, in which the work is introduced into a plasma flow and moved during machining in the plasma flow and then withdrawn over several cycles, has been described by B. S. Danilin, and V. Yu Kireyev in an article entitled "Employment of Low-Temperature Plasma for Pickling and Cleaning of Materials", 1987, Energatomizdat (Moscow) at pages 38–50. However, operating in this way renders a work surface liable to contamination and is quite unacceptable for use with ultra clean surfaces such as very large scale integrated circuits (VLSI circuits).

In yet another previously proposed arrangement mentioned in a publication entitled "Clean Atmosphere Premises" 1990 edited by I. Khayakava and published by MIR Publishers (Moscow) there is described at pages 58 and 59 a method of producing a laminar flow above a protected surface, the flow being produced from an ultra pure medium. The method is open, does not require a protective chamber, and can therefore be integrated comparatively easily into a continuous automated process. However, the method described is not sufficiently reliable for practical use, and is subject to the effects of turbulence.

SUMMARY OF THE INVENTION

The present invention is concerned with arrangements which either create a shielded zone around a work surface or provide a shielding gas jet in a controlled way.

The above and still further objects, features and advantages of the present invention will become apparent upon consideration of the following detailed descriptions of specific embodiments thereof, especially when taken in conjunction with the accompanying drawings.

DESCRIPTION OF PREFERRED EMBODIMENT

Figure 1:
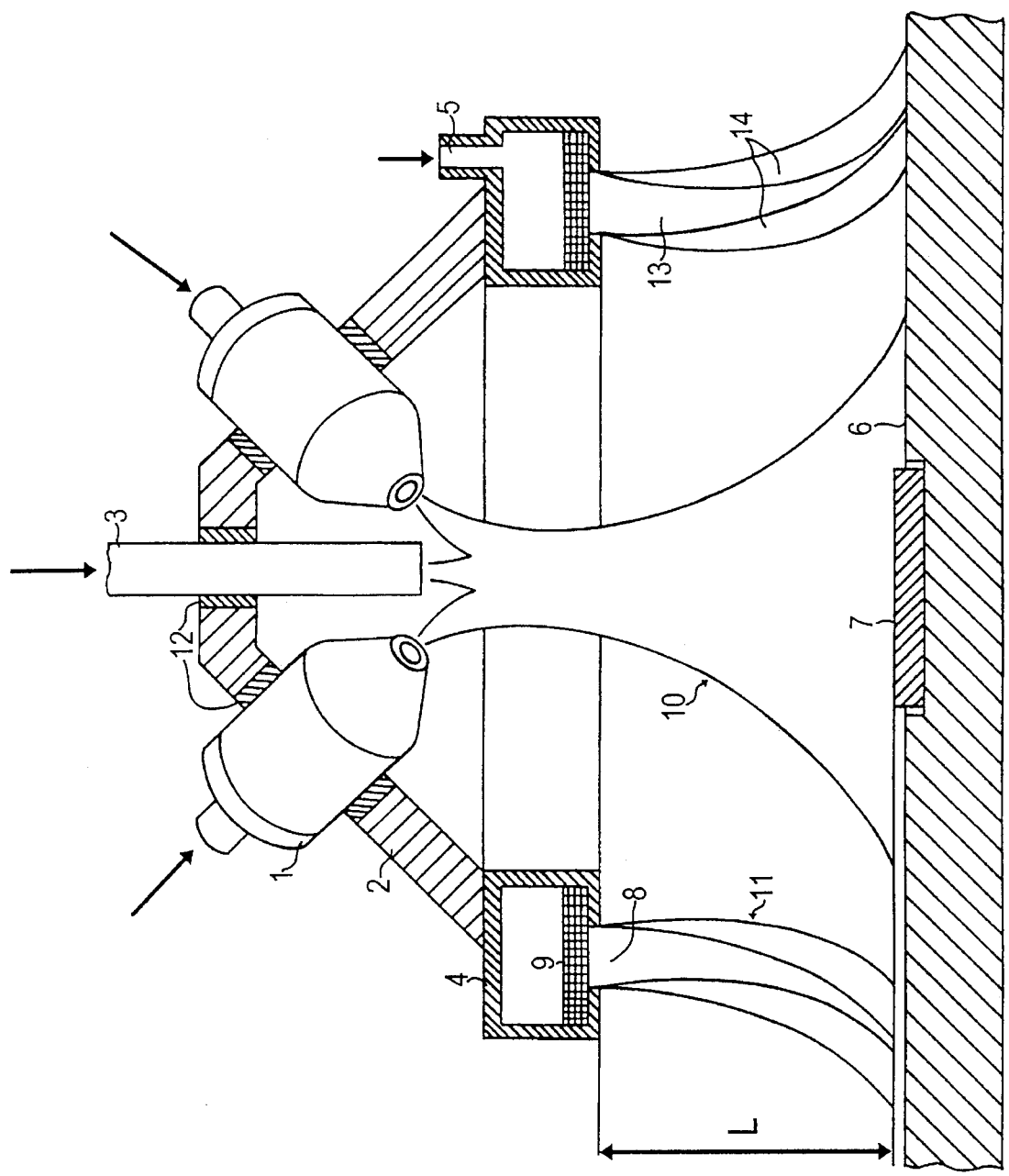
FIG. 1 is a diagrammatic cross section through a plasma jet apparatus.

Referring to FIG. 1, which illustrates a simple version of a plasma jet apparatus, there is shown a generator of plasma jet at atmospheric pressure including two electrode units 1 connected to a system for the delivery of plasma-generating gas and to a supply source (not shown in the drawing). The electrode units 1 pass through sealed openings in a gas-tight partition 2. A feeder 3 for the delivery of working material also passes through a sealed opening in the partition 2. The feeder 3 is in the form of a pipe whose longitudinal axis is vertical in the plane of the drawing. The electrode units 1 are arranged symmetrically with this axis. The axes of the electrode units 1 are set at acute angles to the axis of the feeder 3. A ring type shaper 4 for producing a jet-type shielding-gas screen is provided in the form of a closed pipe or tube of rectangular cross-section, which is connected rigidly over its entire perimeter with the gas-tight partition 2, so that the partition 2 covers completely the space inside the ring formed by the shaper 4. The shaper 4 together with the partition 2 are capable of moving in both the horizontal and the vertical planes. The shaper 4 communicates with a shielding-gas delivery system (not shown in the drawing) through a pipe 5. The shaper 4 is mounted above a holder 6 of a workpiece 7. The holder 6 is in the form of a conveyor loaded at one end with the workpiece 7, which is removed, after machining, from the other end of the conveyor. Throughout the length of the wall of the shaper 4 which faces the plane of the holder 6 there is a slot 8 which thus extends over the entire ring face of the shaper 4. The slot 8 is covered by an element 9 made from a porous material.

Let us consider the functioning of the apparatus in relation to the deposition of a copper film on the surface of the workpiece 7 which is in the form of a glass ceramic substrate.

Electric voltage and plasma-generating gas in the form of argon are delivered to the electrode units 1. The jets of argon plasma from the electrode units 1 form a combined jet 10. Then the working material in the form of gaseous freon is delivered into the centre of the combined plasma jet 10 through the feeder 3. Simultaneously, the shielding gas in the form of purified argon flows through the pipe 5 into the shaper 4. Passing through the element 9 which covers the slot 8, the shielding gas, which in this example is in the form of argon, forms a uniform circular shielding gas screen 11, which protects the space inside the circular screen 11 formed by the shielding gas against the penetration of the space by contaminating particles and oxygen from the ambient medium.

Workpiece 7, which may be a glass ceramic substrate 7 mounted on the holder 6 is brought into the machining zone, i.e. into the zone of the combined plasma jet 10. Here, the freon delivered through the feeder 3 is broken down into excited atoms and ions of carbon and fluorine. The excited atoms and ions are directed by the plasma jet 10 onto the substrate 7 whose surface is practically always laden with organic impurities which would impair the adhesion of any deposited layers.

The interaction of the active atoms and ions with the substrate 7 cleans the surface of the substrate.

On completion of the cleaning process, particles of finely-dispersed copper powder or vapours of hetero-organic copper-containing substance are delivered through the feeder 3 into the plasma jet 10.

This substance is broken down in the plasma jet 10 and the copper atoms are deposited on the surface of the substrate 7. Inasmuch as the circular shielding gas screen 11 keeps oxygen from penetrating into the operating or machining zone, the substrate 7 is enabled to become coated with a layer of pure copper film without any impurities in the form, for example, of copper oxides.

As with any jet, the plasma jet 10 tends to build up a vacuum around itself, thus sucking in air from the ambient medium. To ensure that there is no infiltration of air or other impurities from outside the partition 2, the electrode units 1 and the feeder 3 are secured in pressure-tight seals in the gas-tight partition 2 by means of sealing gaskets 12, which may be made, for example, of fluoroplastic material.

As has been explained above, the shielding gas screen 11 has three parts, two of which are of particular importance with regard to the requirements explained above. The initial inner part 13 is of importance because it is devoid of impurities from the ambient medium. The zone 14 is of importance both where the jet 10 mixes with the ambient medium within the space inside the ring and outside the ring in acting as a buffer to the part 13. The screen 11 must protect the machining space or zone both from contaminating particles and from the penetration of air from the ambient medium. This is best attained if the mixing of the shielding gas flow 11 with the ambient medium is reduced by reducing the turbulence with which the flow would otherwise be affected in mixing with the ambient medium in a chaotic and intensive manner.

Of importance in reducing turbulent mixing, is the element 9 which equalizes the flow of gas in the shaper 4, the element 9 being made from a porous material with an ordered structure. Such an element 9 can be made, for example, from a set of fine-mesh elements or filters arranged one behind the other.

However, the uniformity of the inner part 13 of the flow is maintained over a limited length. It has been found to be practicable for a good result that a distance L between the plane of the slot 8 and the surface of the substrate 7 should not exceed the length of the part 13 and be determined by the relation:

$$L = R^2 V / D_2 \qquad (1)$$

where

V=velocity of shielding gas jet 11;

R=width of pipe slot 8; and $D_2$=coefficient of diffusion of ambient medium particles into the shielding gas jet 11.

In the arrangement shown in FIG. 1 the width of the slot $R=10^{-2}$ m the velocity of the argon gas V=0.5 m/s, and the coefficient of diffusion under normal conditions in a uniform flow is $D_2=10^{-4}$ m²/s. Substituting these values into the formula for L, we find:

$$L = (10^{-2})^2 \cdot 0.5/10^{-4} = 0.5 \text{ m}$$

Thus, the distance between the surface of the machined substrate 7 and that of the slot 8 is 0.45 m.

Figure 2:
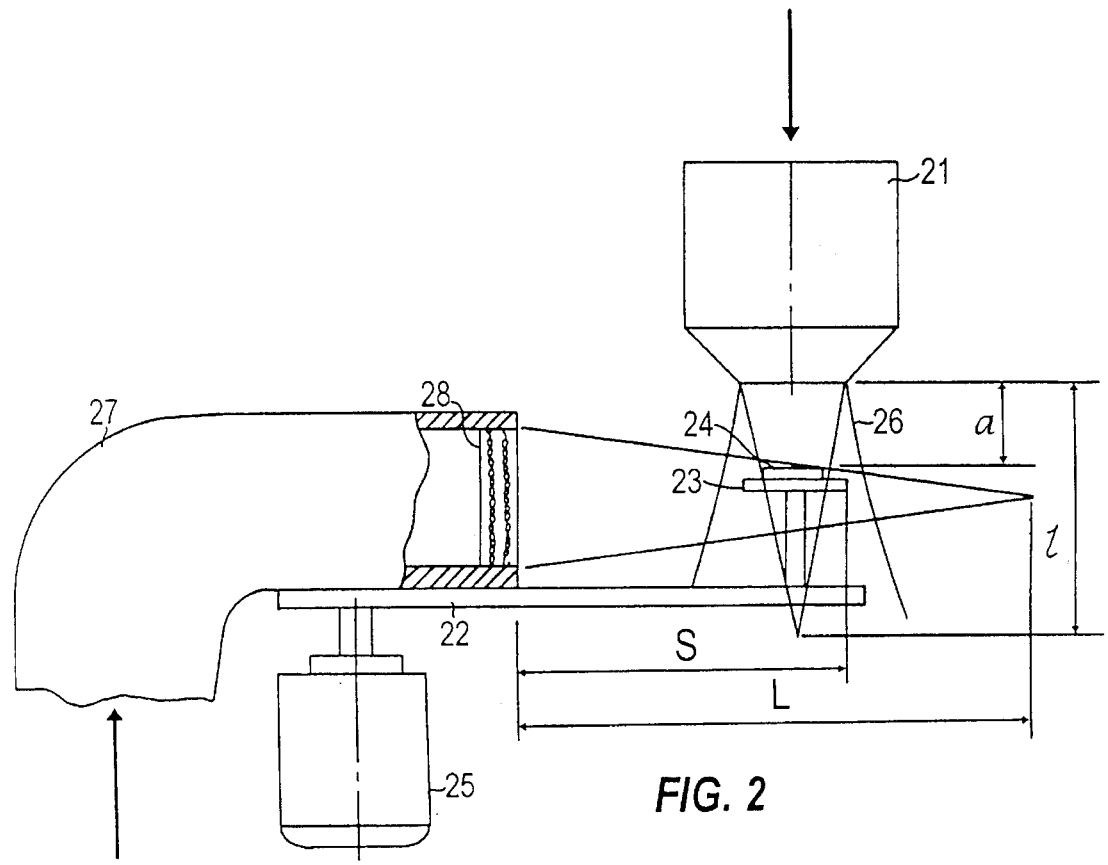
FIG. 2 is a diagrammatic side view, partially cut away, of a second apparatus.

Referring now to FIG. 2, there is shown another apparatus from which it will be possible to understand a further method for use in protecting and treating a surface.

In FIG. 2, the apparatus includes a generator 21 of a plasma jet at atmospheric pressure which is capable of performing various operations, such as cleaning, pickling, the deposition of layers, and the activation of a surface, etc., depending on the kind of active articles delivered by the system for delivering the plasma-generating gas (not shown in the drawing). A work carrier 22 provided with a holder 23 for a workpiece 24 has a drive 25 for introducing the work 24 into, and withdrawing it from, the operative or machining zone of a plasma jet 26 of the generator 21. With the carrier 22 there is arranged a jet shaper in the form of a circular cross-section pipe 27 whose outlet hole has a diameter of $2 \cdot 10^{-2}$ m. The pipe 27 communicates with a source of shielding gas (not shown in the drawing), for example cold nitrogen. The outlet hole of the pipe 27 faces the holder 23 for the workpiece 24. The longitudinal axis of the shielding gas jet which is directed from the outlet of the pipe 27 is parallel to the surface of the workpiece 24. Installed in the outlet hole of the pipe 27 is a gas-permeable element 28 made of a set of perforate screens. This element 28 creates a uniform flow of gas at the outlet of the pipe 27. A distance S between the opposite edge of the workpiece 24 and the outlet hole of the pipe 27 is selected such that:

$$S < V_g b^2 / D_2 \qquad (2)$$

where

V=gas dynamic velocity of the shielding gas jet emitted from 28;

b=diameter of outlet hole of the pipe 27; and $D_2$=coefficient of diffusion of atoms and molecules of the ambient medium into the shielding gas jet.

Let us consider the functioning of the apparatus disclosed in FIG. 2 to explain the essence of the method for the plasma machining of a work surface.

The plate 24 to be machined is mounted on the holder 23 and the shielding gas (cold nitrogen) is delivered into the pipe 27 at a velocity of $V_g=0.25$ m/s. Knowing that the pipe diameter, b, is $2.10^{-2}$ m and the coefficient of diffusion for cold nitrogen $D=10^{-4}$ m²/s, let us find the length L of the initial part of the shielding gas jet from:

$$L=V_g R^2/D \quad (3)$$

where $V_g$=velocity of the gas in the shielding jet;

R=the distance across the shielding gas jet; and $D_2$=diffusion coefficient of ambient medium matter in the jet.

Thus $L=0.25 \cdot (2.10^{-2})^2/10^{-4}=1$ m.

Thus, reliable protection of the machined plate 24 will be ensured by setting a distance S less than 1 m between the outlet hole of the pipe 27 and the end of the holder 23 opposite to the pipe 27, for example S=0.7 m, in which case the axis of the shielding gas jet lies in the plane formed by the surface of the machined plate 24. Thus, the plate 24 is fully enclosed in the initial part of the shielding gas jet.

Before switching on the generator 21, it must be arranged so as to carry out machining of the plate 24 by the initial part of the plasma jet.

Let us consider machining using argon plasma.

The nozzle diameter of the general 1 $d=10^{-3}$ m, the velocity of plasma flow $V_p=100$ m/s, the diffusion coefficient for argon plasma at a pressure of $10^5$ Pa and a temperature of $10^4$K, and a value of $D_2=10^{-3}$ m²/s. In order to determine the appropriate length of the initial part of the plasma jet, let us substitute these values into equation:

$$l=V_p d^2/D, \quad (4)$$

where $V_p$=velocity of plasma jet;

d=diameter of plasma jet;

$D_1$=coefficient of diffusion.

Thus $l=100 \cdot (10^{-3})^2/10^{-3}=cm$.

Now we set at distance of a 7 cm. This is the distance a between the surface of the plate 24 and the plane of the outlet hole of the nozzle of the generator 21.

After switching on the generator 21, the drive is started and the carrier 22 moves the plate 24 on the holder 23 into the plasma jet machining zone of the generator 21. The plate surface is machined by moving it through the plasma jet 26 from the generator 21. The flow of plasma is not broken by the jet of shielding gas emitted from the pipe 27 because the velocity head of the plasma flow is considerably higher than that of the gas jet. As the machined plate 24 emerges from the plasma jet 27, it is again blown over with a jet of shielding gas and the machining cycle can be repeated over again.

A feature of this embodiment is that the workpiece is machined in the initial part of the plasma flow during the continuous movement of the workpiece in the plasma flow, the machined surface being blown across by the jet of shielding gas before it is introduced into the plasma flow, and withdrawn from the plasma flow with the jet of shielding gas parallel with the machined surface, the work being held in the initial part of the shielding gas jet.

Figure 3:
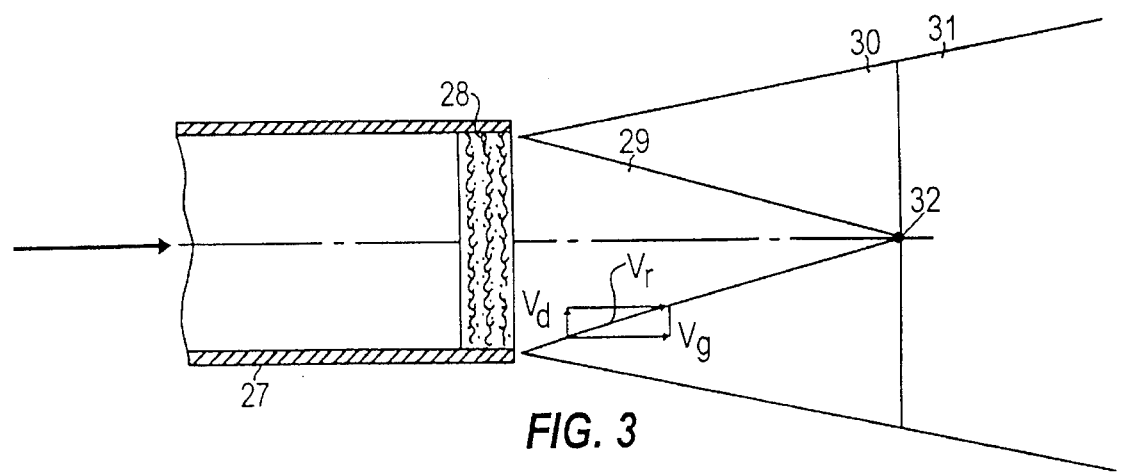
FIG. 3 is a diagrammatic section through a part of the apparatus shown in FIG. 2.

Let us now consider FIG. 3 which enables the properties of the shaped shielding gas jet to be explained more clearly. When gas is delivered into the pipe 27, which has the gas-permeable element 28 at its end, the velocity of the gas flow at the outlet of the pipe 27 is uniform. In this situation it is found that the discharged jet of gas has three distinctive parts whose boundaries appear in FIG. 3, namely an initial part 29, a zone 30 where the gas jet is mixed with the ambient medium, and a main part 31. In this particular case, the initial part 29 has the shape of a cone. The cone is formed due to the tendency of the gas particles of the ambient medium to diffuse into the jet of shielding gas at a velocity of $V_d$ in the direction perpendicular to the jet axis, and to the tendency of the particles of shielding gas to move by inertia at a velocity of $V_g$ in the axial direction. By summing up these two velocity vectors, we obtain a vector of resultant velocity $V_r$. This is the actual direction followed by the particle that has penetrated into the gas jet.

Thus, a particle of gas of the ambient medium situated in the miscibility zone 30 can get on to the axis of the shielding gas jet only at points located to the right of the point 32 in the Figure. This point 32 defines the length of the shielding zone from the plane of the outlet hole of the pipe 27. As can been seen from the above, particles of the ambient medium are absent from the zone 29. Similar conclusions can be arrived at for determining the distance 1 for the plasma flow which can be found from relation (4).

By placing the machined plate 24 (FIG. 2) at a distance of S<L from the pipe 27 and at a distance of a<l from the plasma flow generator 21 one can be preclude the penetration of contaminating particles from the ambient medium.

The method described with reference to FIGS. 2 and 3 for the plasma machining of a work surface produces high-quality articles at high machining speeds. It is particularly valuable in making very-large-scale integrated circuits (VLSI). By changing the active components fed into the plasma generator the method provides for a complete production cycle of VLSI circuits, from the preliminary cleaning to the deposition of layers under conditions of hydrodynamic protection which rule out the penetration of contaminating particles on to the surface of the work. The complete isolation of the work surface from the contaminating effect of the ambient medium enables plasma machining to be conducted in any gaseous medium, including air.

Figure 4:
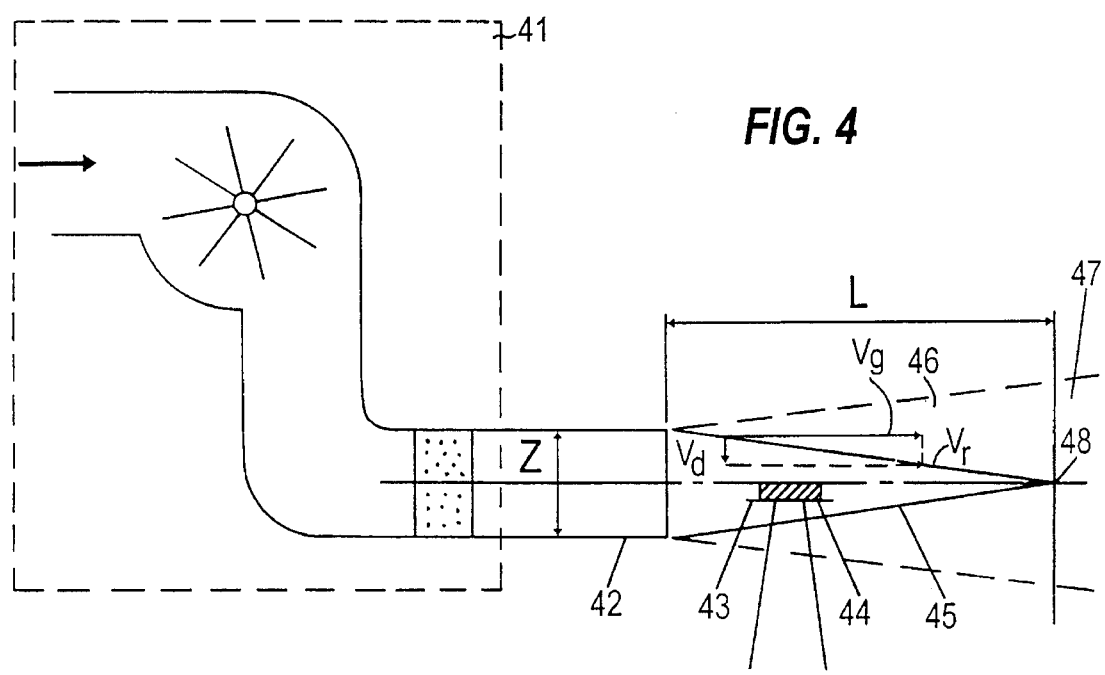
FIG. 4 is a diagrammatic cross sectional view of another form of apparatus.

Referring now to FIG. 4, there is shown yet another apparatus from which it will be possible to understand yet another way of protecting and treating a surface.

The apparatus of FIG. 4 includes a unit 41 for shaping an ultra-pure gas jet, having a circular cross-section pipe 42 with an outlet diameter $Z=10^{-2}$ m.

In front of the outlet of the pipe 42 there is a holder 43 which carries a work to be protected, for example a plate 44. The geometrical axis of the pipe 42 lies in the plane formed by the surface of the plate 44 and the work is arranged in the middle of a gas jet 45 which is blown from the pipe 42. The apparatus of FIG. 4 functions as follows.

Purified gas, for example argon, is delivered through the shaping unit 41 via the pipe 42 towards the plate 44 to be protected. The discharged jet of gas has three distinct parts whose boundaries appear in FIG. 4 namely an initial part 45, a zone 46, where the gas jet mixes with the ambient medium, and a main part 47. The initial part 45 is, in this particular case, cone-shaped. The cone is formed due to the tendency of the gas particles of the ambient medium to diffuse into the shielding gas jet at a velocity of $V_d$ in a direction perpendicular to the longitudinal axis of the jet and to the tendency of the shielding gas particles to move by inertia in the direction of the longitudinal axis of the jet at a velocity $V_g$. Thus, particles of gas of the ambient medium in the mixing zone 46 can get on the axis of the shielding gas jet only in the points located to the right of point 48 on the drawing. The point 48 determines the length of the protection zone from the plane of the outlet of the pipe 42. It can been seen from the above that the part 45 is free of particles of the ambient medium.

For the jet of shielding gas, namely argon, at a pressure $P=10^5$ Pa, $T\sim 300$K, $Z=10^2$ m, $V=1$ m/s, using a conventional equation of state for calculating the concentration n, and the formula of molecular physics for determining the coefficient of diffusion D, we obtain $n=10^{25}$ m$^{-3}$, $D=10^{-4}$ m$^2$/s, and, substituting these values into the formula for the height of the cone:

$$L=VZ^2/D \qquad (5)$$

where

V=the velocity of the gas jet;

Z=the transverse dimension of the gas jet; and

D=the coefficient of diffusion, we obtain the result that L=1 m.

It becomes clear from the above description of the arrangement of FIG. 4 that features of the method disclosed for the protection of ultra-pure surfaces involves the creation of a jet of an ultra-pure gas medium and arranging the protected surface with respect to the jet so that the initial part of the jet blows across the length of the part of jet which blows across the protected surface being found from the relation:

$$L=VZ^2/D$$

where

V=the velocity of the gas jet;

Z=the transverse dimension of the gas jet; and

D=the coefficient of diffusion.

This method of FIG. 4 for the protection of a work surface minimises the possibility of impurities getting on to the work surface and precludes unwanted chemical reactions. The method of FIG. 4 is particularly important for making integrated circuits (VLSI). It permits the entire VLSI production cycle, from the preliminary cleaning to the deposition of layers, to be conducted in conditions of hydrodynamic protection, which rules out the penetration of contaminating particles and unwanted chemical reactions on the work surface. Complete isolation of the work surface from the contaminating and chemical effects of the ambient medium permits machining to be carried out in any gaseous medium including air.

It will be seen from the description of FIG. 1 that, in the particular apparatus described, there is gaseous protection of a work zone which enables plasma treatment of a surface to take place. In the particular apparatus there is a generator of a plasma jet at atmospheric pressure, with a system for the delivery of plasma-generating gas, a feeder delivering the work material and a work holder arranged with provision for relative movement to one another in order to enable a workpiece to be introduced into the treatment of machining zone and to be withdrawn from it, the apparatus having means for providing a jet-type shielding screen of gas around a work holder the space defined by the means for providing the screen of gas having a gas-tight cover through which a plasma generator and a feeder of the plasma generating gas pass.

An advantage of the arrangement described with reference to FIG. 1 is that a protected treatment or machining zone can be provided without the need for vacuum chambers. This makes it possible to create a preset composition of the treatment or machining arrangement, which increases the technological capabilities of the apparatus, particularly by minimising the possibility of chemical interaction between the ambient medium and the surface of the work. Thus, the protective zone provided makes it less likely that deposited films of pure metals will be oxidized with oxygen from the air or that there will be interaction between photoresist masks with oxygen thereby improving their durability. The arrangement described with reference to FIG. 1 also precludes the penetration from the ambient medium of microscopic particles which would otherwise cause the spoilage of articles, e.g. the penetration of particles commensurable with the dimensions of structures used in the manufacture of large-scale and very-large-scale integrated circuits VSI and VLSI.

For a rational layout and for the simplicity of design it is preferable, but not essential, that the generator and feeder of the gas plasma should be positioned in openings in the gas-tight partition. The generator and feeder should be well sealed in the partition to prevent the infiltration of gas from the ambient medium through loose joints and, consequently, prevent penetration of contaminating particles into the machining zone. Such a layout is simple and compact.

To reduce turbulence, the slot 8 in the shaper 4 providing the jet-type shielding-gas screen is covered throughout its length with an element 9 made from a porous material having a regular ordered structure which permits the delivered shielding gas flow to be equalised and enables a uniform flow to be obtained at the shaper outlet, the flow functioning as a jet-type shielding gas screen.

As a result of this arrangement the speed of contaminating particles and dust passing through the shielding gas screen drops proportionally with a reduction in the turbulence of the flow. Thus, by installing such an element 9 in the slot 8 of the shaper duct 4 it becomes possible, by changing the ratio between the speed of diffusion of contaminating particles and the speed of the flow proper to enlarge the zone where the technologically suitable medium having the required composition is formed for conducting the process of plasma machining.

The shielding gas flow discharged from the shaper 4 of the jet-type shielding-gas screen is divided, fundamentally, into three parts, viz, an initial part in which there are no contaminating particles from the ambient medium and whose molecular composition corresponds completely to the initial composition of shielding gas, a zone where the shielding gas jet mixes with the ambient medium, and the main part of the jet in which initial gas is completely mixed with the ambient gaseous medium. The boundaries of these parts are determined by the discharge speed of the flow, the geometrical dimensions of the shaper slot, and the coefficient of diffusion of particles of ambient medium in the shielding gas jet.

To minimise the penetration of microscopic particles, atoms and molecules from the ambient medium into the plasma flow due to diffusion through the shielding gas flow, the distance between the plane of the work holder and that of the slot can be set not to exceed the size 1 of the initial part which is found from the relation:

$$L=VR^2/D$$

where

V=speed of shielding gas jet;

R=width of pipe slot;

D=coefficient of diffusion of ambient medium particles in shielding gas jet.

It will be understood from the description of FIGS. 2 and 3 that an important feature of the arrangement described is the provision of a method for use in plasma machining of a work surface, in which the work is protected by a flow of gas which minimises the possibility of contaminating particles contained in an ambient medium from settling on to the work surface.

In the arrangement described with reference to FIGS. 2 and 3 the method of cleaning and machining a work surface includes the introduction of the work into a plasma flow, the continuous movement of the work in the flow of plasma and the withdrawal of the work from the flow of plasma in which, before the work is introduced into, and after the withdrawal of the work from the flow of plasma, a jet of shielding gas, which is so directed that it is parallel with the work surface, is blown across the surface of the work, the work being placed in an initial part of the shielding gas jet before the beginning of the main part of the jet.

An advantage of the method disclosed in FIGS. 2 and 3 for the plasma machining of a work surface is that the standard of machining is improved because this method is able to minimise the penetration of contaminating particles from the ambient medium onto the work. The protective effect is achieved because the initial part of the jet within which the machined surface is positioned is devoid of dust particles and any other particles might be contained in the ambient medium. Particles that are able to penetrate the jet due to diffusion have a velocity which is directed from the jet periphery to its centre and the addition of the jet gas and the particle diffusion velocities in the jet results in the formation of a cone-like initial part of the jet which is free of contaminating particles that might come from the ambient medium. This effect is attainable both during turbulent and laminar flow of gas in the initial part of the jet, though in the case of laminar flow the velocity of diffusion is considerably lower than that of the flow proper and the length of the initial part of the jet is particularly great. The size L of the initial part can be found as has been mentioned above from the following relation:

$$L=V_g R^2/D$$

where $V_g$=velocity of gas in shielding jet;

R=cross dimension of shielding gas jet;

D=diffusion coefficient of ambient medium matter in jet.

If the flow of the initial part of the shielding jet is of a turbulent nature, a value for turbulent diffusion must be used, while in the case of laminar flow, a conventional molecular diffusion coefficient must be used. Knowing the relation between the dimensions and the velocities, one can avoid placing the work surface in the main part of the jet, where turbulent mixing usually prevails and where contaminating particles from the ambient medium can easily be carried on to the machined surface.

The contamination of the machined surface with particles from the ambient medium and unwanted chemical reactions on the surface can be best minimised not only by placing the work into the initial part of the shielding gas jet both before and after introducing it to the jet of plasma, but also in the course of machining for which purpose the work is machined in the initial part of the plasma jet whose length may be found from the following relation:

$$l=V_p d^2/D$$

where $V_p$=velocity of plasma jet;

d=diameter of plasma jet;

D=coefficient of diffusion.

In this kind of machining any unwanted chemical reaction on the machined surface, e.g. oxidation of the deposited layer, can be avoided by using an inert shielding gas.

The method disclosed in FIGS. 2 and 3 can be realized by means of the plasma machining apparatus described which has a generator of plasma jet at atmospheric pressure with a system for the delivery of plasma-generating gas and a carrier provided with a work holder, both the generator and carrier being arranged with provision for relative movement to enable the work to be brought into, and withdrawn from, the machining zone wherein the apparatus has a shielding gas jet shaper in the form of a pipe or duct which communicates with a source of shielding gas and which is arranged on the carrier with its outlet directed towards the work holder, the distance S from the pipe outlet hole to the opposite edge of the work holder being selected from the relation:

$$S \leq V_g b^2/D$$

where $V_g$=velocity of shielding gas jet;

b=diagonal or diameter of pipe outlet hole;

D=coefficient of diffusion of ambient medium in shielding gas jet.

It will be understood from the description of FIG. 4, that an important feature of the arrangement described in that figure is that it is possible to protect ultra-pure surfaces by blowing a gas jet which is not affected by turbulence in ambient medium over the surfaces, and in the provision of a method and an apparatus for the realization of this protection arrangement.

The method for the protection of an ultra-pure surface which has been described with reference to FIG. 4 involves the creation of a jet of ultra-pure gaseous medium which is blown over the surface to be protected, the work surface to be protected being arranged in an initial part of the jet which is blown over the surface, the length of the initial part of the jet being found from the relation:

$$L=VZ^2/D$$

where

V=velocity of gas jet;

Z=transverse dimension of gas jet at its point of origin;

D=coefficient of diffusion of the ambient medium.

An advantage of the method disclosed with reference to FIG. 4 for the protection of ultra-pure surfaces lies in its reliability, since the protected work is blown with the initial part of the jet, as defined herein, which does not depend on the nature of jet flow. The initial part of the jet is defined by the fact that the vector of the velocity at which particles and molecules of gas penetrating from the ambient medium is the resultant of two vectors, i.e. the velocity of diffusion of the particles and molecules and the velocity of the gas jet, these vectors being orthogonal to each other. Therefore, in the main laminar jet flow, the diffusion rate of particles and molecules will be at a minimum; hence, the length of the initial part of the jet will be a maximum. Conversely, in a turbulent jet flow, the diffusion rate will be high while the length of the initial part will be at a minimum. However, irrespective of the nature of the jet flow there will always be a part devoid of impurities coming from the ambient medium, and the composition of the gas in this part will be governed solely by the composition and degree of purification of the delivered shielding gas.

The method disclosed in FIG. 4 can be carried out using the apparatus shown for the protection of ultra-pure surfaces which includes a unit for shaping an ultra-pure gas jet with a pipe installed at its outlet, the outlet hole of the pipe facing a work holder, the work holder, being disposed in a zone defined by a cone whose base is constituted by the outlet hole of the pipe, and the height of the cone L being determined by the relation:

$$L=VZ^2/D$$

where

V=velocity of gas jet;

Z=transverse dimensions of gas jet;

D=coefficient of diffusion.

This arrangement for the protection of ultra-pure surfaces described with reference to FIG. 4 makes possible the realization of the above-described method in a very simply way with the features and advantages of the method mentioned above.

It will be understood that, although the invention has been described, by way of example, with reference to particular embodiments, variations and modifications thereof may be made, and other embodiments may be conceived, within the scope of the appended claims.

We claim:

1. A method of plasma machining or treating a work surface, comprising generating a plasma jet at substantially atmospheric pressure by mixing a plasma-generating gas with a working material, supplying the plasma jet at substantially atmospheric pressure to the work surface while the work surface and the plasma jet move relative to each other so the work surface moves into and out of a machining zone, surrounding the plasma jet with a shaped jet-type shielding gas screen flowing from a pipe or duct through a slot surrounding the plasma jet and facing towards the machining zone so a volume defined by the walls of the pipe or duct is covered by a gas-tight partition, and positioning the work holder and the slot so they are spaced from each other by a distance that is no greater than $$L=R^2V/D$$

where

V=the velocity of the shielding gas jet;

R=the width of the slot in the pipe or duct; and

D=the coefficient of diffusion of atoms and molecules of an ambient medium into the shielding gas jet.

2. A method as claimed in claim 1 further including sealing the source of the plasma jet and the working material in pressure-tight seals in respective openings of a gas-tight partition which, with the gas screen, encloses the work surface.

3. A method as claimed in claim 1 further comprising causing the shielding gas screen to flow through a porous material having a regular ordered structure that covers the slot throughout its length so the gas screen flow is substantially without turbulence.

4. A method as claimed in claim 1 wherein the gas screen includes an interior portion consisting of the shielding gas and having a length between the slot and the work surface greater than L, the interior portion being surrounded by an exterior portion including a mixture of the shielding gas and materials from the atmosphere, the shielding gas screen being substantially coaxial with the plasma jet.

5. A method as claimed in claim 1 further including flowing the screening gas through a gas permeable nozzle mounted along the entire length of the slot so there is substantially no turbulence in the screening gas incident on the work surface.

6. A method of plasma treating a workpiece surface comprising generating a directed plasma jet to form an operative or treatment zone, the plasma jet, as it emerges from an opening, having a transverse dimension R and a forward velocity $V_p$, forming an additional stream of a shielding or protective gas at the operative or treatment zone, bringing the workpiece surface into the operative or treatment zone, continuously displacing the workpiece surface in the operative or treatment zone so the workpiece surface is brought into and removed from said zone more than once, blowing the additional stream of shielding or protective gas across the workpiece surface being treated before the workpiece is brought into or removed from the operative or treatment zone, and placing the workpiece surface being treated at a predetermined distance ($L_1$) from the opening for the plasma jet, wherein $$L_1=V_pR^2/D_2$$

where $D_2$ =coefficient of diffusion of ambient material into the plasma jet.

7. A method as claimed in claim 6 further including positioning the work surface and the shielding gas so the shielding gas flows in a direction generally parallel to the surface, and positioning a second opening through which the shielding gas flows so it is no further from the work surface than $$L_2=V_gR_2^2/D_2,$$

where:

$V_g$ is the forward velocity of the flow of the protective gas as it propagates toward the surface, $R_2$ is the transverse dimension of the second opening as protective gas flows through the opening, and $D_2$ is the coefficient of diffusion of atoms and molecules from the surroundings into the protective gas jet.

8. A method as claimed in claim 6 wherein the protective gas jet flows through a gas-permeable nozzle mounted in the second opening.

9. A method as claimed in claim 6, wherein an opening through which the protective gas jet flows and a remote end of a holder for the workpiece are positioned so $S_3<V_gR^2/D$ where: $V_g$ is the forward velocity of the protective gas jet.

10. A method of protecting an ultra-clean surface from an ambient medium comprising forming a jet having an interior portion of an ultra-pure gaseous medium surrounded by a mixture of the ultra-pure gaseous medium and the ambient medium, the interior portion of the jet having a length L, $$L=VZ^2/D$$

where

V=velocity of gas jet;

Z=transverse dimension of the shielding gas jet at its origin; and

D=coefficient of diffusion of the ambient medium into the ultra-pure gaseous medium;

blowing the jet over the surface to be protected; and positioning the surface and the origin of the gas jet so the jet as it blows over the surface is no farther from the origin than L.

11. A method of treating a workpiece surface in a generally open environment including ambient materials comprising directing a plasma treating jet toward the surface in a direction generally normal to the surface, the plasma treating jet including an interior portion containing only gases in the plasma and no ambient materials, the interior portion being surrounded by a portion including a mixture of the plasma gases and the ambient materials, directing a shielding jet toward the surface from a direction that is not generally normal to the surface while the treating jet is being directed toward the surface, the shielding jet including an interior portion including only gases of the shielding jet surrounded by a portion including a mixture of the shielding jet gases and the ambient materials, and positioning the workpiece surface and the treating jet and the shielding jet so the interior portions of the treating jet and the shielding jet are simultaneously incident on the same portion of workpiece surface.

12. The method of claim 11 wherein the interior portion of both of said jets have a conical configuration, the conical configurations intersecting on said same portion of the workpiece surface.

13. The method of claim 12 wherein said treating and shielding jets are respectively emitted from first and second openings, positioning said same portion of the workpiece surface from said first opening by a distance no greater than $V_p d^2/D_1$ where $V_p$=forward velocity of gases in the treating jet d=diameter of the treating jet as it emerges from the first opening, and $D_1$=diffusion coefficient of the ambient materials into the treating jet, positioning said same portion of the workpiece surface from said second opening by a distance no greater than $V_g R^2/D_2$ where $V_g$=forward velocity of gases in the shielding jet R=diameter of shielding jet as it emerges from the second opening, and $D_2$=diffusion coefficient of the ambient materials into the shielding jet.

14. The method of claim 13 wherein longitudinal axes of the treating and shielding jets are approximately at right angles to each other.

15. A method of treating a workpiece surface in a generally open environment including ambient materials comprising directing a plasma treating jet toward the surface in a direction generally normal to the surface, directing a shielding jet toward the surface while the treating jet is being directed toward the surface, the shielding jet including an interior portion including only gases of the shielding jet surrounded by a portion including a mixture of the shielding jet gases and the ambient materials, and positioning the workpiece surface and the treating jet and the shielding jet so the interior portion of the shielding jet is incident on the workpiece surface simultaneously with the treating jet being incident on the workpiece surface so the interior portion of the shielding jet prevents ambient materials from flowing into the portion of the workpiece surface on which the treating jet is incident.

16. The method of claim 15 wherein the shielding jet is emitted from an opening, and positioning the opening from which the shielding jet is emitted from the portion of the workpiece surface on which the treating jet is incident by a distance no greater than $$V_g R^2/D_2$$

where $V_g$=forward velocity of gases in the shielding jet

R=transverse dimension of shielding jet as it emerges from the opening, and $D_2$=diffusion coefficient of the ambient materials into the shielding jet.

17. The method of claim wherein the treating and shielding jets are arranged so the interior portion of the shielding jet surrounds the treating jet.

18. The method of claim 15 wherein the treating and shielding jets are arranged so the interior portion of the shielding jet intersects the treating jet on the workpiece surface.

19. A method of treating a portion of an integrated circuit workpiece substrate surface in a generally open environment including ambient materials comprising (a) removing impurities from the surface position by applying to the surface portion a plasma jet including at least one of excited atoms and ions that remove the impurities from the surface portion, (b) then, after the impurities have been removed by step (a) applying to the surface portion a plasma jet including a material that treats the surface portion, and (c) while steps (a) and (b) are being performed preventing the ambient materials from being incident on the surface portion by applying to the surface a shielding jet having an interior portion including only gases of the shielding jet surrounded by a portion including a mixture of the shielding jet gases and the ambient materials, and (d) positioning the workpiece surface and the treating jet and the shielding jet so the interior portion is incident on the surface portion.

20. The method of claim 19 wherein the material is deposited as a layer on the surface portion.

21. The method of claim 19 further including the step of moving the workpiece relative to the jets.

22. The method of claim 19 wherein the shielding jet is emitted from an opening, positioning the portion of the workpiece surface on which the treating jet is incident and the opening from which the shielding jet is emitted by a distance no greater than $$V_g R^2/D_2$$

where $V_g$=forward velocity of gases in the shielding jet

R=diameter of the shielding jet as it emerges from the opening, and $D_2$=diffusion coefficient of the ambient materials into the shielding jet.

* * * * *